(12) United States Patent
Chiu

(10) Patent No.: US 7,297,877 B2
(45) Date of Patent: Nov. 20, 2007

(54) SUBSTRATE WITH MICRO-VIA STRUCTURES BY LASER TECHNIQUE

(75) Inventor: Chi-Tsung Chiu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 567 days.

(21) Appl. No.: 11/015,683

(22) Filed: Dec. 17, 2004

(65) Prior Publication Data

US 2005/0133251 A1 Jun. 23, 2005

(30) Foreign Application Priority Data

Dec. 18, 2003 (TW) ............................... 92136045 A

(51) Int. Cl.
*H01K 12/04* (2006.01)
(52) U.S. Cl. .................. 174/262; 174/266; 156/630
(58) Field of Classification Search ............... 156/630; 174/266, 262
See application file for complete search history.

(56) References Cited

U.S. PATENT DOCUMENTS 4,931,134 A * 6/1990 Hatkevitz et al. ............. 216/17
6,137,064 A * 10/2000 Kiani et al. .................. 174/266
6,201,194 B1 * 3/2001 Lauffer et al. ............... 174/264

* cited by examiner

*Primary Examiner*—Dean A. Reichard
*Assistant Examiner*—Andargie Aychillhum
(74) *Attorney, Agent, or Firm*—Thomas, Kayden, Horstemeyer & Risley

(57) ABSTRACT

A substrate to which a laser technique is applied includes a signal layer, a micro via structure, and a differential signal pair. The micro via structure is divided into a first conductive column and a second conductive column after a laser-cutting step. The first conductive column includes a first flat conductive layer, and the second conductive column includes a second flat conductive layer. A first trace of the differential signal pair is parallel to and electrically connected to the first flat conductive layer. A second trace of the differential signal pair is parallel to and electrically connected to the second flat conductive layer. The distance between the first trace and the second trace is the same as the distance between the first flat conductive layer and the second flat conductive layer. The reflection of high-speed signals and the noise interferences can be reduced.

12 Claims, 3 Drawing Sheets

SUBSTRATE WITH MICRO-VIA STRUCTURES BY LASER TECHNIQUE

This application claims the benefit of Taiwan application Serial No. 92136045, filed Dec. 18, 2003, the subject matter of which is incorporated herein by reference.

BACKGROUND OF THE INVENTION

1. Field of the Invention

The invention relates in general to a substrate to which a laser technique is applied, and more particularly to a substrate applied to high frequency field.

2. Description of the Related Art

Micro-via on a substrate can be categorized by blind via, buried via and through via. Conventionally, the micro-via, of which the bore diameter is larger than 200 μm, is formed by mechanically drilling and others are formed by a laser technique.

The conventional laser technique is using a laser with an optical system to work on a target workpiece. A pulsed laser beam can be focused on the target workpiece by a mirror or a prism, and the density of the laser power ranges from 105 to 1015 Watts per square centimeter (W/cm$^2$). Such high laser power density can drill on any materials.

Because the heat inputted by the laser beams is highly more than the heat reflected, transmitted or spread by the materials, the materials are heating very fast and evaporating to form a micro-via. Several continuing micro-via form a cutting line with a narrow width by relatively moving the laser beams and the workpiece so that the substrate is cut. Further, a proper assisting gas can be added during the cutting process to help chemical reaction or remove the molten ashes in the cutting line.

Referring to FIG. 1A, it is a lateral view of a conventional micro via structure to which a laser technique is applied. The integrated-layer substrate 100 includes a build-up layer 102 and a core layer 104. The micro-via structure is disposed on the build-up layer 102. The differential signal pair on the upper layer 110 is electrically connected to the differential signal pair on the lower layer 112 by a conductive layer 108.

Referring to FIG. 1B and FIG. 1C, FIG. 1B is a top view of a conventional micro via structure to which a laser technique is applied, and FIG. 1C is a three-dimensional view of a conventional micro via structure to which a laser technique is applied. A third dielectric layer 114 is formed in the micro-via structure 106 by a laser technique to separate the micro-via structure 106 into a first camber conductive layer 116 and a second cambered conductive layer 118. The differential signal pair 110 includes a first trace 1101 and a second trace 1102. The first trace 1101 is electrically connected to the right conductive column 116, and the second trace 1102 is electrically connected to the left conductive column 118.

Generally, the differential signal pair 110 is used to suppress the common mode noise as long as the distance between two traces of the differential signal pair 110 is constant and small. When the distance between two traces of the differential signal pair 110 is less, the coupling capacity is higher, and the common mode noise is easier to be suppressed.

However, as for the conventional micro-via structure 106, the first camber conductive layer 116 and the second camber conductive layer 118 are curve-shapes structures so that the distance there between changes and is larger than the distance between the first trace 1101 and the second trace 1102. As the result, the coupling capacity decreases due to the increasing of the distance, and the characteristic impedance of the differential signal pair 110 won't be kept in a constant. The reflection of high-speed signals and the noise interferences will be raised and may produce electromagnetic interference (EMI).

SUMMARY OF THE INVENTION

It is therefore an object of the invention to provide a substrate to which a laser technique is applied. The substrate with micro-via structure can keep the coupling capacity when the signals are transmitted and prevents the change of the transmit route, so that the reflection of high-speed signals and the noise interferences can be reduced.

The invention achieves the above-identified object by providing a substrate to which a laser technique is applied includes a signal layer, a micro-via structure, and a differential signal pair. The micro-via structure includes a first conductive column, a second conductive column, and a third dielectric layer. The first conductive column includes a first flat conductive layer, a first dielectric layer, and a first cambered conductive layer, wherein the first dielectric layer is enclosed between the first flat conductive layer and the first cambered conductive layer. The second conductive column is opposite to the first conductive column and includes a second flat conductive layer, a second dielectric layer, and a second cambered conductive layer, wherein the second dielectric layer is enclosed between the second flat conductive layer and the second cambered conductive layer. The third dielectric layer is disposed between the first conductive column and the second conductive column, and is for electrically separating the first flat conductive layer and the second flat conductive layer. The differential signal pair is disposed on the signal layer, and includes a first trace and a second trace. The first trace is electrically connected to one end of the first flat conductive layer, and the second trace is electrically connected to one end of the second flat conductive layer. The distance between the first trace and the second trace is the same as the distance between the first flat conductive layer and the second flat conductive layer.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
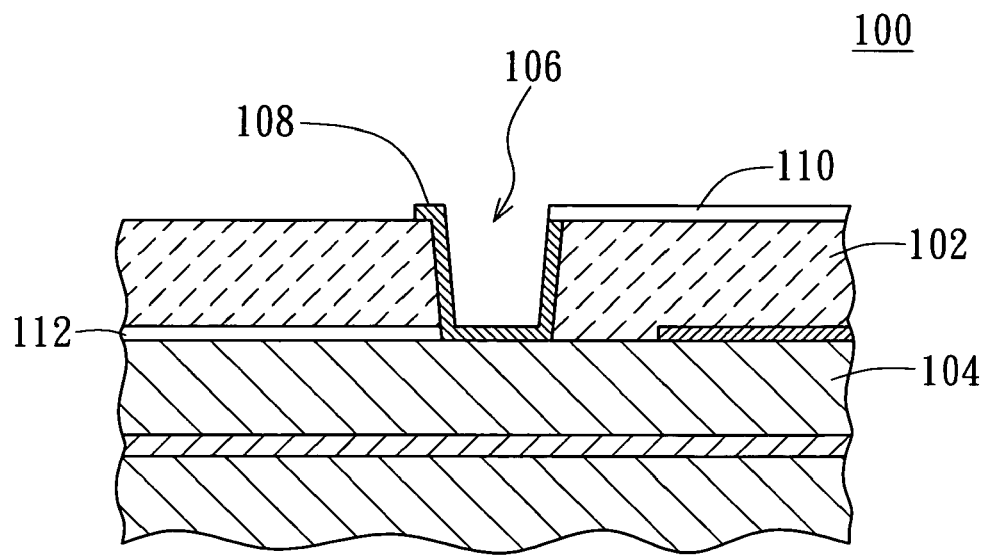
FIG. 1A (Prior Art) is a lateral view of a conventional micro via structure to which a laser technique is applied.
Figure 1B:
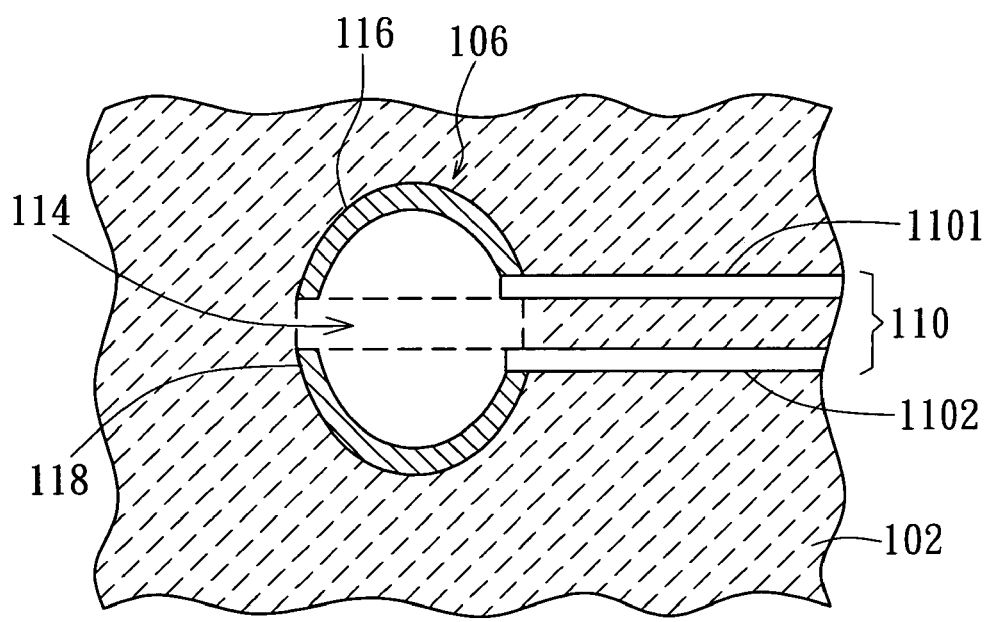
FIG. 1B (Prior Art) is a top view of a conventional micro via structure to which a laser technique is applied.
Figure 1C:
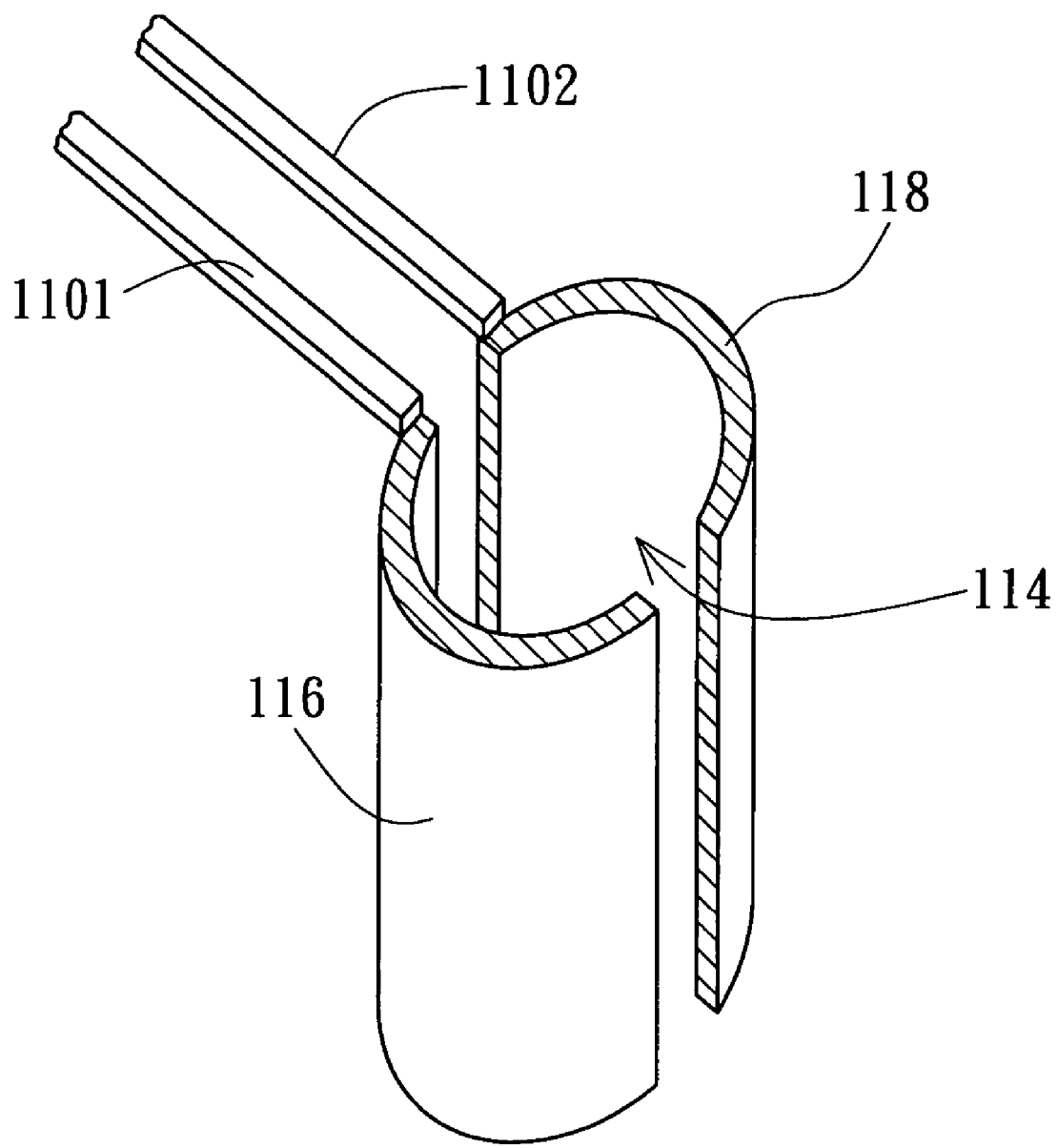
FIG. 1C (Prior Art) is a three-dimensional view of a conventional micro via structure to which a laser technique is applied.
Figure 2A:
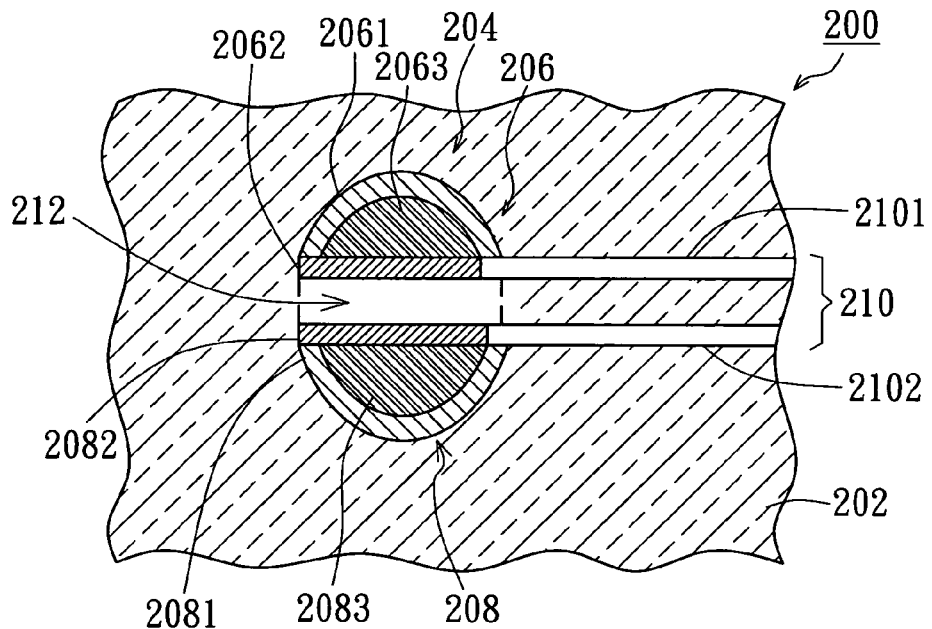
FIG. 2A is a top view of a substrate to which a laser technique is applied according to the preferred embodiment of the invention.
Figure 2B:
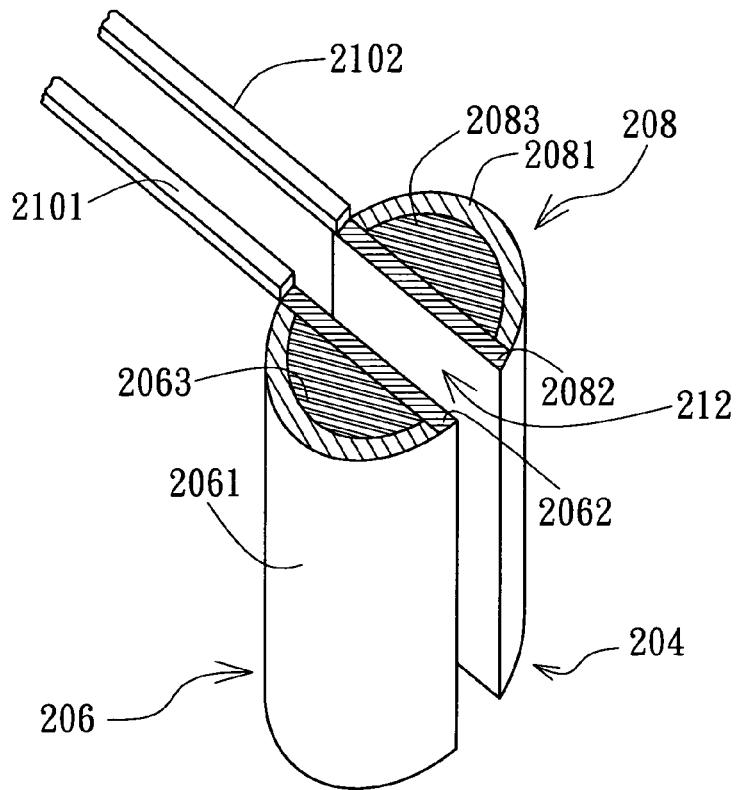
FIG. 2B is a three-dimensional view of a substrate to which a laser technique is applied according to the preferred embodiment of the invention.

Referring to FIG. 2A and FIG. 2B, FIG. 2A is a top view of a substrate to which a laser technique is applied according to the preferred embodiment of the invention, and FIG. 2B is a three-dimensional view of a substrate to which a laser technique is applied according to the preferred embodiment of the invention. The substrate with a micro-via structure includes a substrate 200, a micro-via structure 204, and a differential signal pair 210. The substrate 200 has a signal layer 202, and the micro-via structure 204 disposed on the substrate 200 includes a first conductive column 206, and a second conductive column 208.

The first conductive column 206 includes a first cambered conductive layer 2061, a first flat conductive layer 2062, and a first dielectric layer 2063. The first dielectric layer 2063 is enclosed between the first cambered conductive layer 2061 and the first flat conductive layer 2062 to form a structure like a sandwich.

The second conductive column 208 is opposite to the first conductive column 206 and includes a second cambered conductive layer 2081, a second flat conductive layer 2082, and a second dielectric layer 2083. Similar to the first conductive column 206, the second dielectric layer 2083 is enclosed between the second cambered conductive layer 2081 and the second flat conductive layer 2083. The second flat conductive layer 2082 is parallel to the first flat conductive layer 2062, and a third dielectric layer 212 is disposed there between.

The micro-via structure 204 is formed by applying a laser technique. For example, a micro-via is first formed on the substrate 200 by ultraviolet (UV) rays, and the inner surface of the micro-via is coated by a conductive layer to form a conductive column. Then, dielectric materials are filled in the conductive column to form a dielectric layer. The laser technique is applied again to cut the conductive column and the dielectric layer so as to form the first cambered conductive layer 2061, the second cambered conductive layer 2081, and two dielectric layers which are parallel to each other. Lastly, the two dielectric layers are coated with conductive layers respectively to for a first flat conductive layer 2062 and a second flat conductive layer 2082.

The differential signal pair 210 is formed by a semiconductor technique. For example, a copper layer is disposed on the signal layer 202, and several required transmission lines are formed by mask, developing and etching. The differential signal pair is one of the transmission lines disposed on the signal layer 202 of the substrate 200 and includes a first trace 2101 and a second trace 2102. The first trace 2101 is electrically connected to one end of the first flat conductive layer 2062, and the first trace 2101 and the first flat conductive layer 2062 are linear-arranged. The second trace 2102 is electrically connected to one end of the second flat conductive layer 2082, and the second trace 2102 and the second flat conductive layer 2082 are linear-arranged. The distance between the first trace 2101 and the second trace 2102 is the same as the distance between the first flat conductive layer 2062 and the second flat conductive layer 2082.

It is clear to see in FIG. 2A that the tops of the first trace 2101 and the first flat conductive layer 2062 are linear-arranged, and the tops of the second trace 2102 and the second flat conductive layer 2082 are linear-arranged, too. As the result, the characteristic impedance of the differential signal pair 210 can keep constant. That is, the first flat conductive layer 2062 and the second flat conductive layer 2082 can be considered as the extension of the first trace 2101 and the second trace 2102 and have same functions.

The laser technique disclosed in the present invention includes using carbon dioxide lasers or ultraviolet (UV) rays. Taking the excimer lasers, one of the ultraviolet (UV) lasers, as the example, the drilling process can be divided by a direct writing process and a mask projection. The wavelength for the excimer lasers is chosen as 157 nm (F2), 193 nm (ArF), 308 nm (XeCl), or 351 nm (XeF). Conventionally, the shorter wavelength brings better result of the ablation for materials processing.

Further, the first cambered conductive layer 2061, the second cambered conductive layer 2062, the first flat conductive layer 2062 and the second flat conductive layer 2082 are formed by a chemical electroplating technique. Besides, the sputtering technique and the electrolytic copper technique can be applied in forming above mentioned conductive layers. The material of the first dielectric layer 2063 and the second dielectric layer 2083 are insulating materials with low dielectric constant, such as epoxy, polyimide(PI), or polycarbonate.

The micro-via structure formed on a substrate by a laser technique according to the preferred embodiment of the present invention includes a first flat conductive layer and a second flat conductive layer in order to keep the constant distance between the first trace and the second trace of the differential signal pair and within the micro-via structure. As the result, the characteristic impedance is constant and the outside noise, such as common mode noise or cross talk, can be equivalently coupled into the first trace and the second trace of the differential signal pair. Also, the coupling capacity is still kept when the signals are transmitted through the micro-via structure. The reflective noise no longer is made due to the change of the characteristic impedance, and the phase of the signals won't be shifted.

It is noted that the laser technique is very suitable for cutting the micro-via because the less distance between two traces of the differential signal pair is the better. The reflection of high-speed signals and the noise interferences can be reduced more effective.

While the invention has been described by way of example and in terms of a preferred embodiment, it is to be understood that the invention is not limited thereto. For example, the micro-via formed by a laser technique is normally is blind via or through via, but the buried via is also obtained by pressing other interlayer with the blind via or through via. It is intended to cover various modifications and similar arrangements and procedures, and the scope of the appended claims therefore should be accorded the broadest interpretation so as to encompass all such modifications and similar arrangements and procedures.

What is claimed is:

1. A substrate to which a laser technique is applied, comprising:
   a signal layer;
   a micro-via structure, including
      a first conductive column, including a first flat conductive layer, a first dielectric layer, and a first cambered conductive layer, wherein the first dielectric layer is enclosed between the first flat conductive layer and the first cambered conductive layer,
      a second conductive column, being opposite to the first conductive column and including a second flat conductive layer, a second dielectric layer, and a second cambered conductive layer, wherein the second dielectric layer is enclosed between the second flat conductive layer and the second cambered conductive layer, and
      a third dielectric layer, disposed between the first conductive column and the second conductive column, for electrically separating the first flat conductive layer and the second flat conductive layer; and a differential signal pair, disposed on the signal layer, including
    a first trace, electrically connected to one end of the first flat conductive layer, and
    a second trace, electrically connected to one end of the second flat conductive layer.

2. The substrate according to claim 1, wherein the first flat conductive layer is parallel to the second flat conductive layer.

3. The substrate according to claim 2, wherein the first trace is parallel to the second trace.

4. The substrate according to claim 3, wherein the distance between the first trace and the second trace is the same as the distance between the first flat conductive layer and the second flat conductive layer.

5. The substrate according to claim 3, wherein the first trace and the first flat conductive layer are linear-arranged, and the second trace and the second flat conductive layer are linear-arranged.

6. The substrate according to claim 1, wherein the laser technique uses carbon dioxide lasers.

7. The substrate according to claim 1, wherein the laser technique uses ultraviolet (UV) rays.

8. The substrate according to claim 7, wherein the laser technique uses excimer lasers.

9. The substrate according to claim 1, wherein the first and second flat conductive layers and the first and second cambered conductive layers are formed by a chemical electroplating technique.

10. The substrate according to claim 1, wherein the first and second flat conductive layers and the first and second cambered conductive layers are formed by an electrolytic copper technique.

11. The substrate according to claim 1, wherein the first and second flat conductive layers and the first and second cambered conductive layers are formed by a sputtering technique.

12. The substrate according to claim 1, wherein the material of the first and second dielectric layers are insulating materials with low dielectric constant.

* * * * *